(12) United States Patent
Bobde

(10) Patent No.: US 8,258,890 B2
(45) Date of Patent: *Sep. 4, 2012

(54) METHODS OF ACHIEVING LINEAR CAPACITANCE IN SYMMETRCIAL AND ASYMMETRICAL EMI FILTERS WITH TVS

(75) Inventor: Madhur Bobde, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 12/807,484

(22) Filed: Sep. 7, 2010

(65) Prior Publication Data

US 2010/0328830 A1   Dec. 30, 2010

Related U.S. Application Data

(63) Continuation of application No. 11/820,072, filed on Jun. 16, 2007, now Pat. No. 7,795,987.

(51) Int. Cl.
*H04B 3/28* (2006.01)

(52) U.S. Cl. ........................................ 333/120; 327/565

(58) Field of Classification Search ............... 333/12; 327/565

See application file for complete search history.

(56) References Cited

U.S. PATENT DOCUMENTS

| | | | |
|---|---|---|---|
| 4,342,013 A * | 7/1982 | Kallman | 333/181 |
| 5,780,905 A * | 7/1998 | Chen et al. | 257/355 |
| 7,795,987 B2 * | 9/2010 | Bobde | 333/12 |
| 2003/0228848 A1 * | 12/2003 | Escoffier et al. | 455/91 |

* cited by examiner

*Primary Examiner* — Evan Pert
(74) *Attorney, Agent, or Firm* — Bo-In Lin

(57) ABSTRACT

A transient voltage suppressing (TVS) circuit with uni-directional blocking and symmetric bi-directional blocking capabilities integrated with an electromagnetic interference (EMI) filter supported on a semiconductor substrate of a first conductivity type. The TVS circuit integrated with the EMI filter further includes a ground terminal disposed on the surface for the symmetric bi-directional blocking structure and at the bottom of the semiconductor substrate for the uni-directional blocking structure and an input and an output terminal disposed on a top surface with at least a Zener diode and a plurality of capacitors disposed in the semiconductor substrate to couple the ground terminal to the input and output terminals with a direct capacitive coupling without an intermediate floating body region.

10 Claims, 4 Drawing Sheets

METHODS OF ACHIEVING LINEAR CAPACITANCE IN SYMMETRCIAL AND ASYMMETRICAL EMI FILTERS WITH TVS

This patent application is a Continuation application of a co-pending application Ser. No. 11/820,072 filed on Jun. 16, 2007 now U.S. Pat. No. 7,795,987. The Disclosures made in the patent application Ser. No. 11/820,072 are hereby incorporated by reference.

BACKGROUND OF THE INVENTION

1. Field of the Invention

The invention relates generally to a circuit configuration and method of manufacturing a transient voltage suppressor (TVS). More particularly, this invention relates to an improved circuit configuration and method of manufacturing a symmetrical bi-directional blocking transient voltage suppressor (TVS) implemented with Zener diodes and zener diode triggered bipolar transistors.

2. Description of the Relevant Art

The conventional technologies for designing and manufacturing a electromagnetic interference (EMI) filter combined with a transient voltage suppressor (TVS) is still confronted with a technical difficulty that the filtering performance may become unreliable due to variation of the capacitance as now implemented in the EMI filter. As will be further discussed below, the variations of the capacitance may be induced through change in the bias voltage and several environmental effects including light and noise. For audio signal receptions, the quality of the incoming signal receptions may be adversely affected when the functions performed by the EMI filters cannot be precisely controlled. Specific functional parameters for signal reception such as the cutoff frequency may be changed due to the variation of the capacitance in the EMI filter when the conditions of the operational environment are changed. Therefore, an urgent demand is now required to provide an effective solution to such problems.

Specifically, a transient voltage suppressing (TVS) circuit is often implemented with an electromagnetic interference (EMI) filter for application of an audio signal reception. The TVS is implemented with an EMI filter that can have either a symmetrical or an asymmetrical configuration as that shown in FIG. 1A or 1B respectively. The EMI filters as shown are implemented with a combination of resistor-capacitor (RC) and resistor-inductor (RL) and integrated with a combined TVS. The EMI filter and TVS integrated circuit are implemented as a monolithic device thus provides advantages that the EMI filter when implemented with TVS has better filtering performance. Typically in a low pass filter to attenuate the cellular band signals in a range of 800 MHz to 3 GHz, an attenuation of at least 35 dB can be achieved. Furthermore, such device has low parasitic resistance, capacitance and inductance.

In the EMI filter implemented with TVS shown in FIGS. 1A and 1B, the capacitance as that required by the EMI filter is typically provided by implementing a Zener diode in the filter and the Zener diode has an inherent junction capacitance. Thus, the diode junction capacitance in the Zener diode implemented in the TVS is also available to function as a capacitor for the EMI filter. However, the junction capacitance of the Zener diode as implemented is also a function of the biased voltage. For the purpose of designing the EMI filters as that shown in FIGS. 1A and 1B, the bias voltage for the symmetrical filter is zero volts and for the bias voltage of the asymmetrical filter is Vcc/2, where Vcc is the supply voltage. However, the capacitance may vary due the bias voltage and that can cause the filter cutoff frequency to vary with the DC bias thus leads to unreliable filtering performance. FIGS. 1C and 1D illustrate measurements of the capacitance variations in symmetric and asymmetric filters as a function of DC bias for a chip-scale package (CSP) and a DFN (DualFlat No Lead) package.

When a symmetrical blocking structure is implemented with the symmetrical EMI filter shown in FIG. 1A, the implementation of the Zener diode is configured to use a floating junction as a result of which the capacitance of the diode junction is very sensitive to the environmental conditions such as light and noise in addition to the variations of the capacitance that is dependent on the DC bias. When the EMI and TVS integrated device is packaged as a chip-scale package (CSP), the integrated EMI-TVS as implemented would require a high capacitance tolerance value of as much as 20% in order to maintain reliable filtering performance with the variation in environment conditions such as light.

Therefore, a need still exists in the fields of circuit design and device manufactures for providing a new and improved circuit configuration and manufacturing method to resolve the above-discussed difficulties. Specifically, a need still exists to provide new and improved EMI filter combined with a TVS that can provide linear and controllable capacitance such that the limitations and difficulties can be resolved.

SUMMARY OF THE PRESENT INVENTION

It is therefore an aspect of the present invention to provide a TVS protection circuit with integrated EMI filter by providing an improved device configuration for the total capacitance between the input terminal and a ground terminal to remain substantially at a constant value such that the above discussed limitations and difficulties as encountered in the conventional technologies may be resolved.

Specifically, one aspect of this invention is to form a TVS circuit integrated with an EMI filter with at least a Zener diode and a plurality of capacitors connected in parallel between an input terminal and a ground terminal wherein the capacitors having a total capacitance maintaining at substantially at a constant value when different biased voltages are applied to the input terminal and the ground terminal.

Another aspect of this invention is to form a TVS circuit integrated with an EMI filter on a semiconductor substrate by forming a doping region to function with the semiconductor substrate as a Zener diode and to open two sets of trenches filled with a dielectric material and a polysilicon gate to function as MOS (Metal-Oxide-Semiconductor) capacitors wherein the number of MOS capacitors with gate terminal connected to an input terminal is substantially equal to the number of MOS capacitors with gate terminal connected to the ground terminal such that the total capacitance is kept at substantially a constant value at different bias voltages applied to the input terminal and the ground terminal. Similarly, two doped regions are formed in the output side of the device with the doped regions to function as Zener diodes. Two sets of trenches filled with dielectric material and a polysilicon gate are opened in the doped regions to function as MOS capacitors wherein the number of MOS capacitors with gate terminal connected to an output terminal is substantially equal to the number of MOS capacitors with gate terminal connected to the ground terminal such that the total capacitance between the output terminal and the ground terminal is kept substantially at a constant value when different bias voltages are applied between the output terminal and the ground terminal.

Briefly in a preferred embodiment this invention discloses an electronic device protected by a transient voltage suppressing (TVS) circuit integrated with an electromagnetic interference (EMI) filter. The TVS circuit integrated with the EMI filter further includes at least a Zener diode connected in parallel to a plurality of capacitors between an input terminal and a ground terminal wherein a total capacitance between the input terminal and the ground terminal having substantially a constant value when applying opposite bias voltages between the input terminal and the ground terminal. In an exemplary embodiment, the EMI filter further includes a symmetrical filter having an equal number of capacitors connected to the input terminal and to the ground terminal. In a specific exemplary embodiment, the TVS integrated with the EMI filter is supported on a semiconductor substrate and the plurality of capacitors includes a plurality of shallow trenches opened in semiconductor substrate filled with a dielectric material. In another exemplary embodiment, the TVS integrated with the EMI filter is supported on a semiconductor substrate and the EMI filter further includes a symmetrical filter having an equal number of shallow trenches opened in the semiconductor substrate for functioning as capacitors connected to the input terminal and to the ground terminal. In another exemplary embodiment, the TVS integrated with the EMI filter is supported on a semiconductor substrate wherein the input terminal is formed in a first doped region in the semiconductor substrate and the ground terminal is formed in a second doped region in the semiconductor substrate; and the semiconductor substrate further including deep isolation trenches disposed between the first and second doped regions. In another exemplary embodiment, the TVS integrated with the EMI filter is supported on a semiconductor substrate of a first conductivity type and the input terminal is formed in a first doped region in the semiconductor substrate and the ground terminal is formed in a second doped region in the semiconductor substrate wherein the first and second doped regions are doped with a second conductivity type whereby a first and second Zener diodes are formed between the first and second doped regions of the second conductivity type and the semiconductor substrate of the first conductivity type.

This invention further discloses a transient voltage suppressing (TVS) circuit integrated with an electromagnetic interference (EMI) filter supported on a semiconductor substrate of a first conductivity type. In case of the symmetric blocking structure, the TVS circuit integrated with the EMI filter includes a ground terminal disposed on the top surface and an input and an output terminal disposed on a top surface with at least a Zener diode and a plurality of capacitors disposed in the semiconductor substrate to couple the ground terminal to the input and output terminals with a direct capacitive coupling without an intermediate floating body region. In an exemplary embodiment, the TVS circuit integrated with the EMI filter further includes two laterally spaced doped regions of one conductivity type placed in a material of a second conductivity type in order to form a bi-directional blocking Zener diode. The first doped regions is contacted to form the input terminal, and the second doped region is contacted to form the ground terminal. Further, a first set of trenches filled with dielectric material and a polysilicon gate are placed in the first doped region and the polysilicon gate is connected with the ground terminal. This forms the first set of MOS capacitors between the input terminal and the ground terminal. Similarly, a second set of trenches filled with dielectric material and a polysilicon gate are placed in the second doped region and the polysilicon gate is connected to the input terminal. This forms the second set of MOS capacitors from the input to ground terminal, and has the opposite connectivity as compared to the first set of trench MOS capacitors. The same scheme is repeated in order to form the zener diodes and the MOS capacitors between the output and the ground terminal. Another two laterally spaced doped regions of one conductivity type placed in a material of a second conductivity type in order to form a bi-directional blocking Zener diode. The fourth doped regions is contacted to form the output terminal, and the third doped region is contacted to form the ground terminal. Further, a third set of trenches filled with dielectric material and a polysilicon gate are placed in the third doped region and the polysilicon gate is connected with the output terminal. This forms the first set of MOS capacitors between the output terminal and the ground terminal. Similarly, a fourth set of trenches filled with dielectric material and a polysilicon gate are placed in the fourth doped region and the polysilicon gate is connected to the ground terminal. This forms the second set of MOS capacitors from the output to ground terminal, and has the opposite connectivity as compared to the first set of trench MOS capacitors. The second and third doped regions are both ground terminals, and are shorted together with metal.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
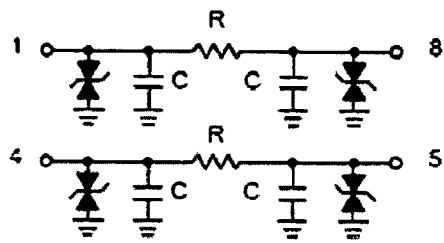
FIGS. 1A to 1B are circuit diagram of the EMI filter combined with TVS circuit.
Figure 1B:
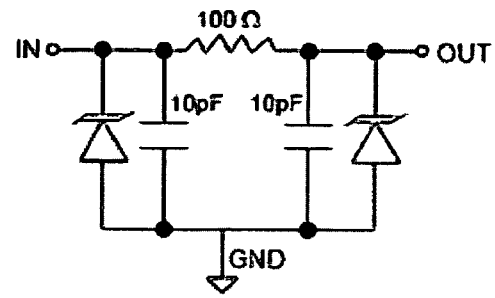
Figure 1C:
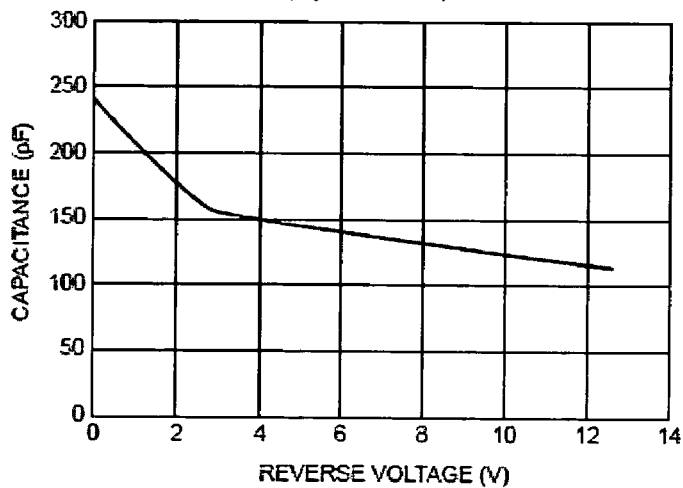
FIGS. 1C and 1D are diagram for showing the variation of the capacitance due the change of the DC bias voltage.
Figure 1D:
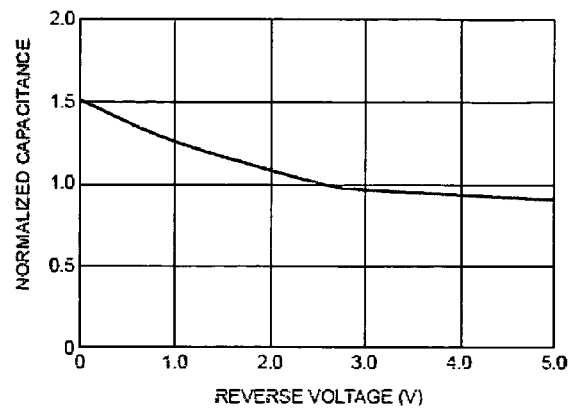
Figure 2:
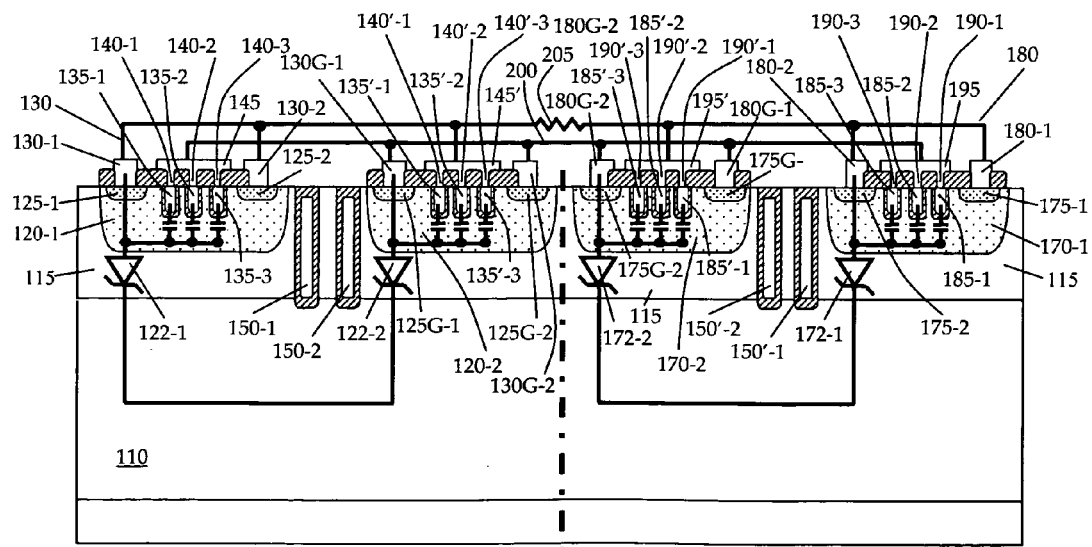
FIG. 2 shows a side cross sectional view for a symmetrical EMI filter combined with a TVS of this invention

Referring to FIG. 2 for a symmetrical EMI filter combined with a TVS of this invention. The symmetrical EMI filter combined with a TVS is supported on a N+ substrate 110 with an N-epitaxial layer 115 and shown with an input side on the left and an output side on the right. The input side of the substrate is doped with a first body region 120-1 and a second body region 120-2 with a P-type dopant. A Zener diode 122-1 is formed between the first doped body region 120-1 and the N-epitaxial layer 115. Another Zener diode 122-2 is formed between the second doped body region 120-2 and the N-epitaxial layer 115. The first body region 120-1 is formed with first contact dopant region 125-1 and a second contact dopant region 125-2 for electrical contacting the electrodes 130-1 and 130-2 for receiving an input voltage therein. The first body region 120-1 further has multiple shallow trenches 135-1, 135-2 and 135-3 filled with dielectric material and a polysilicon gate to function as MOS capacitors. The trench capacitors 135-1 to 135-3 are electrically connected to the ground terminal through metal contacts 140-1 to 140-3 to a contact metal 145 disposed over the top surface of the substrate and the contact metal is connected to the ground terminal. The second body region 120-2 is also formed with a first contact dopant region 125G-1 and a second contact dopant region 125G-2 for electrical contacting the electrodes 130G-1 and 130G-2 for electrically contacting the ground voltage. The second body region 120-2 further has multiple shallow trenches 135'-1 to 135'-3 filled with dielectric material and a polysilicon gate to function as MOS capacitors. The shallow trenches 135'-1 to 135'-3 are electrically connected to the input voltage through metal contacts 140'-1 to 140'-3 respectively and then through contact metal 145' disposed over the top surface of the substrate. There are two deep isolation trenches 150-1 and 150-2 disposed between the first and second body regions 120-1 and 120-2. The deep trenches 150-1 and 150-2 are used for isolation purposes. The device structure has a lateral parasitic PNP transistor. Addition of deep trenches in the base region of the lateral PNP will significantly reduce the gain of the parasitic transistor thereby removing any undesirable current path.

The output side of the substrate is also doped with a first body region 170-1 and a second body region 170-2 with a P-type dopant. The first body region 170-1 is formed with first contact dopant region 175-1 and a second contact dopant region 175-2 for electrical contacting the electrodes 180-1 and 180-2 for providing an output voltage. A Zener diode 172-1 is formed between the first doped body region 170-1 and the N-epitaxial layer 115. Another Zener diode 172-2 is formed between the second doped body region 170-2 and the N-epitaxial layer 115. The first body region 170-1 further has multiple shallow trenches 185-1 185-2 and 185-3 filled with dielectric material and a polysilicon gate to function as MOS capacitors. The shallow trenches 185-1 to 185-3 are electrically connected to the ground terminal through metal contacts 190-1 to 190-3 respectively and then through the contact metal 195 disposed over the top surface of the substrate. The second body region 170-2 is also formed with a first contact dopant region 175G-1 and a second contact dopant region 175G-2 for electrical contacting the electrodes 180G-1 and 180G-2 for electrically contacting the ground voltage. The second body region 170-2 further has multiple shallow trenches 185'-1 to 185'-3 filled with dielectric material and a polysilicon gate to function as MOS capacitors. The shallow trenches 185'-1 to 185'-3 are electrically connected to the output voltage through metal contacts 190'-1 to 190'-3 respectively and then through the contact metal 195' disposed over the top surface of the substrate. The two ground body regions 120-2 and 170-2 are shorted together with metal 200. The input and the output terminals 130 and 180 are interconnected with a series resistor 205 formed by a polysilicon layer to function as a filter resistor between the input and the output terminals of the EMI-TVS device. There are two deep isolation trenches 150'-1 and 150'-2 disposed between the first and second body regions 170-1 and 170-2. The deep trenches 170-1 and 170-2 are used for isolation purposes. The device structure has a lateral parasitic PNP transistor. Addition of deep trenches in the base region of the lateral PNP will significantly reduce the gain of the parasitic transistor thereby removing any undesirable current path.

Figure 3:
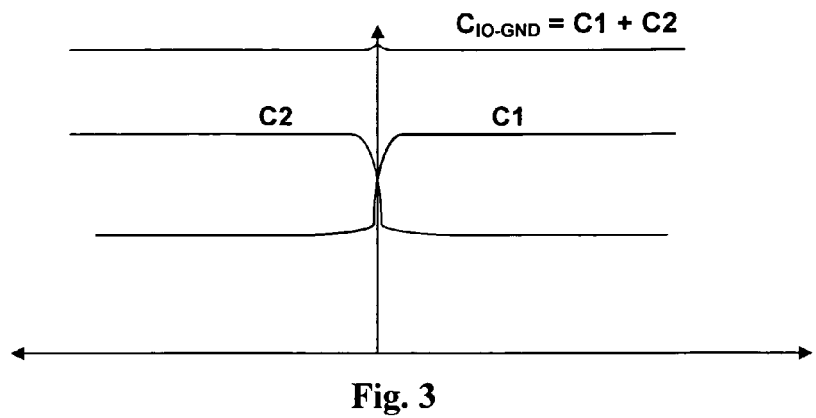
FIG. 3 is a diagram for illustrating the variation of capacitance as function of bias voltage and the total capacitance is kept substantially constant because the complimentary nature of the first and second capacitors now provide in the EMI-TVS device of this invention.

Referring to FIG. 3 for a diagram that illustrates the variations of capacitance versus voltage, i.e., a C-V diagram for MOS capacitor. The capacitance-voltage (C-V) diagram is FIG. 3 illustrates a typical C-V relationship for the trench capacitors. The capacitors are formed between the trench polysilicon in the shallow trenches. There are half of the trench capacitors with gate terminal connected to the input terminal and the other half of the trench capacitors with gate terminal connected to the ground. Therefore, C1 represents half of the total capacitance between the input terminal to the ground terminal and C2 represents another half of the total capacitance from the input terminal to the ground terminal. The variations of the capacitances C1 and C2 as that shown in the C-V curve therefore have a mirror image one to another. The total sum of these two capacitances C1 and C2, i.e., Ctotal=C1+C2, therefore maintains a constant value and is independent of the variation of the voltage. The symmetry of filtering operation is achieved by connecting one-half of the total number of trenches to the input the remaining number of trenches to the ground voltage.

Figure 4:
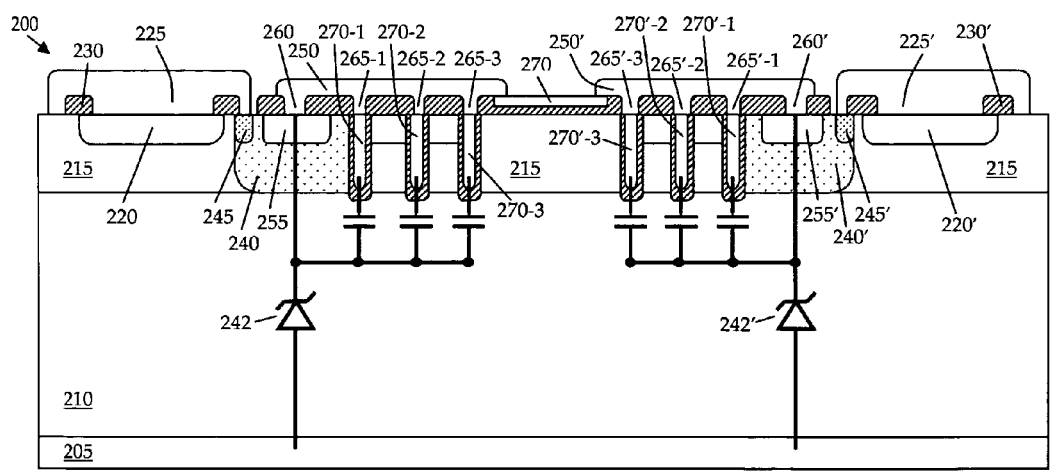
FIG. 4 shows a side cross sectional view for an asymmetrical EMI filter combined with a TVS of this invention

Referring to FIG. 4 for a side cross sectional view of an asymmetrical EMI filter combined with a TVS circuit 200 according to an improved device configuration of this invention. The EMI filter combined with a TVS circuit 200 is supported on a semiconductor substrate 210 having a bottom electrode 205 connected to a ground voltage. The EMI filter and TVS device 200 is shown with an input side on the left and an output side on the right. In the input side, the substrate 210 includes a plurality of trenches 270-1, 270-2 and 270-3 disposed in an N-epitaxial layer 215 supported on the N+ substrate 210. The trenches 270-1 to 270-3 with the epitaxial layer 215 are connected to the input voltage through metal contact 265-1 to 265-3 penetrates through an insulation layer 230. The Zener diode is implemented using a vertical NPN transistor which is triggered by a lateral Zener diode. The collector of the NPN is implemented with a N+ doped layer 255 and the base is implemented with a P doped layer 240. The emitter is implemented with the N+ doped substrate 210. The trigger for the NPN is implemented with a lateral Zener diode formed between the N+ collector 255 and the P Base 240. The surface doping of the P Body is adjusted using a separate shallow P type implant to control the Zener breakdown voltage. The P anode terminal of the lateral Zener diode is shorted to the ground terminal using a shallow P+ implant 245. A separate metal 225 is used to contact the shallow P+ implant and connect it to the substrate via a N+ doped layer 220 and the N− epitaxial layer 215.

In the output side, the substrate 210 includes a plurality of trenches 270'-1, 270'-2 and 270'-3 disposed in an N-epitaxial layer 215 supported on the N+ substrate 210. The trenches 270'-1 to 270'-3 with the epitaxial layer 215 are connected to the output voltage through metal contact 265'-1 to 265'-3 penetrates through an insulation layer 230'. The Zener diode is implemented using a vertical NPN transistor which is triggered by a lateral Zener diode. The collector of the NPN is formed by a N+ doped layer 255' and the base is formed by a P doped layer 240'. The emitter is formed by the N+ doped substrate 210. The trigger for the NPN is formed by a lateral Zener diode formed between the N+ collector 255' and the P Base 240'. The surface doping of the P Body is adjusted using a separate shallow P type implant to control the Zener breakdown voltage. The P anode terminal of the lateral Zener diode is shorted to the ground terminal using a shallow P+ implant 245'. A separate metal 225' is used to contact the shallow P+ implant and connect it to the substrate via a N+ doped layer 220' and the N− epi layer 215. The input and the output terminals 250 and 250' are interconnected with a series resistor formed by a polysilicon layer to function as a filter resistor between the input and the output terminals of the EMI-TVS device 200.

In the EMI-TVS integrated device there is a direct capacitive coupling between the IO terminals 250 and 250' and GND terminal 205 without a floating body between them. The capacitance requires smaller area due to the fact that when there is a floating body in between, the net capacitance from IO terminal to the Ground terminal will be the series capacitance of the two junction capacitances, which will be much smaller than the individual junction capacitances. There is no sensitivity to the light or other changes of the environmental conditions because of the direct capacitive coupling, without the floating base. The filtering capacitance is therefore independent of the DC bias because of the symmetric capacitance for positive and negative bias. The constant capacitance provides special advantage in real applications, because the device with constant capacitance can pass the low frequency audio/data signal that can vary from +Vcc to −Vcc, over the entire range of the rated supply voltage for this device. The high frequency RF signal, which is supposed to be filtered by this device, will be over-riding on top of the low frequency signal. In contrast, if the filter capacitance varies as a function of voltage, the filter performance of the device also changes depending on the voltage level of the low frequency audio/data signal. The filter may achieve high attenuation of the RF signal as 0 Bias, but its attenuation will decrease significantly at +/−Vcc bias, if its capacitance decreases with bias. By implementing an asymmetrical EMI filter combined with a TVS circuit 200 of this invention, such difficulties are therefore resolved.

Figure 5:
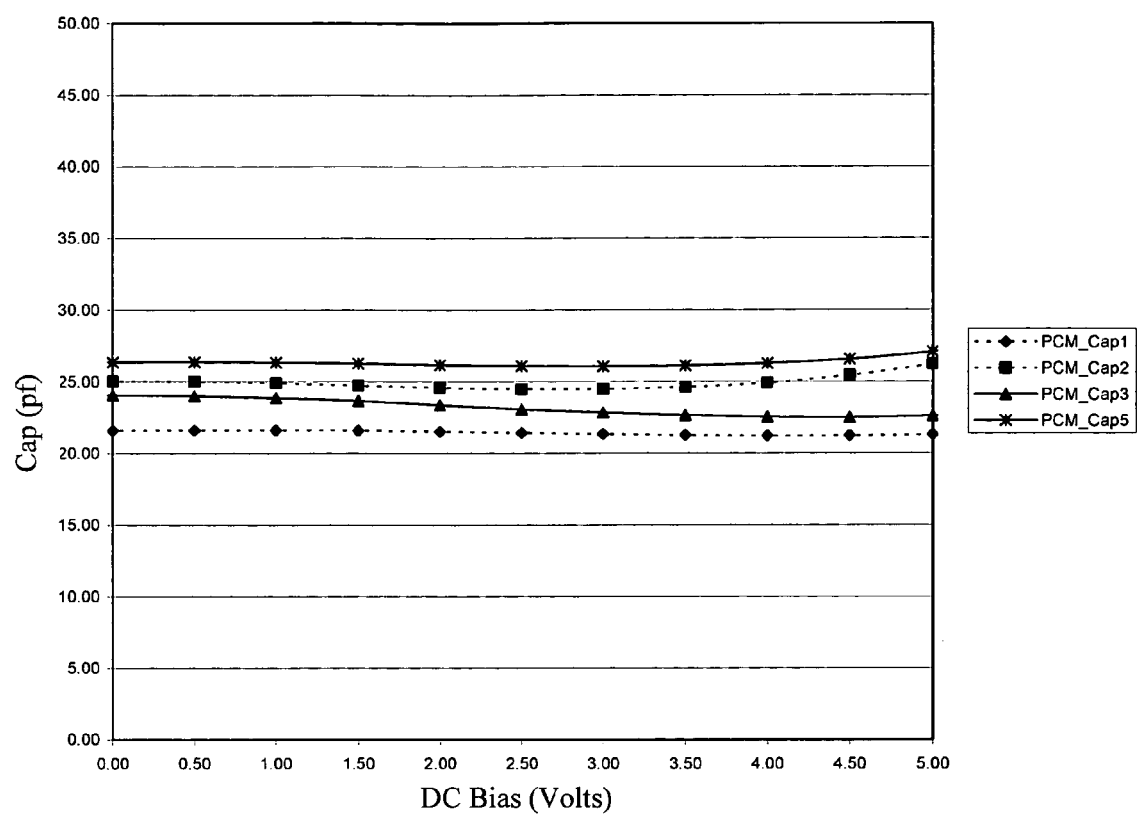
FIG. 5 is a diagram for showing the variation of capacitance versus DC bias voltage for a EMI-TVS device of FIG. 4.

FIG. 5 is a diagram for showing the variations of the capacitance versus the DC bias voltage. The capacitance is formed between the trench polysilicon to the N-epitaxial layer and N+ source regions in the MOS device in the accumulation mode. The capacitance does not change with the voltage bias because for all positive biases, the N epitaxial layer is in accumulation mode, and the capacitance from the gate to substrate is the MOS oxide capacitance.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An electronic device protected by a bi-directional symmetric blocking transient voltage suppressing (TVS) circuit integrated with an electromagnetic interference (EMI) filter wherein:
said TVS integrated with said EMI filter further comprising at least a Zener diode connected in parallel to a plurality of capacitors between an input terminal and a ground terminal wherein a total capacitance between said input terminal and said ground terminal having substantially a constant value when applying opposite bias voltages between said input terminal and said ground terminal.

2. The electronic device of claim 1 wherein:
said TVS integrated with said EMI filter is supported on a semiconductor substrate wherein said input terminal is formed in a first doped region in said semiconductor substrate and said ground terminal is formed in a second doped region in said semiconductor substrate; and
said semiconductor substrate further including deep isolation trenches disposed between said first and second doped regions.

3. The electronic device of claim 1 wherein:
said TVS integrated with said EMI filter is supported on a semiconductor substrate of a first conductivity type and said input terminal is formed in a first doped region in said semiconductor substrate and said ground terminal is formed in a second doped region in said semiconductor substrate wherein said first and second doped regions are doped with a second conductivity type whereby a first and second Zener diodes are formed between said first and second doped regions of said second conductivity type and said semiconductor substrate of said first conductivity type.

4. A method for protecting an electronic device by a transient voltage suppressing (TVS) circuit integrated with an electromagnetic interference (EMI) filter comprising:
integrating said TVS with said EMI filter by connecting at least a Zener diode in parallel to a plurality of capacitors between an input terminal and a ground terminal and arranging a total capacitance between said input terminal and said ground terminal having substantially a constant value when applying opposite bias voltages between said input terminal and said ground terminal.

5. The method of claim 4 wherein:
said step of integrating said TVS with said EMI filter further comprising a step of forming said plurality of capacitors on a semiconductor substrate as a plurality of shallow trenches opened in said semiconductor substrate filled with a dielectric material and connecting an equal number of shallow trenches opened in said semiconductor substrate for functioning as capacitors connected to said input terminal and to said ground terminal thus forming a symmetrical EMI filter connected to said TVS.

6. The method of claim 4 further comprising:
forming a first doped region in said semiconductor substrate for connecting to said input terminal and forming a second doped region in said semiconductor substrate for connecting to said ground terminal, and
forming deep isolation trenches in said semiconductor substrate between said first and second doped regions.

7. The method of claim 4 wherein:
said step of connecting said Zener diode in parallel to a plurality of capacitors further comprising a step of forming a first and a second doped regions of a second conductivity type in a semiconductor substrate of a first conductivity type constituting two Zener diodes between said first and second doped regions and said semiconductor substrate and opening a plurality trenches filled with a dielectric material for forming a plurality of junction capacitors in said first and second doped regions and further connecting said first and second doped region to said input terminal and said ground terminal respectively.

8. The method of claim 7 wherein:
said step of opening said plurality of trenches in said first and second doped regions further comprising a step of opening an equal number of trenches in said first and second doped regions in said semiconductor substrate whereby a total amount of capacitance is kept at substantially constant value when reversed bias voltages are applied between said input terminal and said ground terminal.

9. The method of claim 4 further comprising:
forming a third and a fourth doped regions of a second conductivity type in a semiconductor substrate of a first conductivity type constituting a third and a fourth Zener diodes between said third and fourth doped regions and said semiconductor substrate and opening a plurality trenches filled with a dielectric material for forming a plurality of junction capacitors in said third and fourth doped regions and further connecting said third and fourth doped regions to an output terminal and said ground terminal respectively.

10. The method of claim 9 wherein:
said step of opening said plurality of trenches in said third and fourth doped regions further comprising a step of opening an equal number of trenches in said third and fourth doped regions in said semiconductor substrate whereby a total amount of capacitance is kept at substantially constant value when reversed bias voltages are applied between said output terminal and said ground terminal.

* * * * *